(12) United States Patent
Koyama et al.

(10) Patent No.: US 7,851,831 B2
(45) Date of Patent: Dec. 14, 2010

(54) TRANSISTOR

(75) Inventors: Hidetoshi Koyama, Tokyo (JP);
Yoshitaka Kamo, Tokyo (JP); Toshihiko Shiga, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 117 days.

(21) Appl. No.: 11/859,846

(22) Filed: Sep. 24, 2007

(65) Prior Publication Data

US 2008/0246060 A1 Oct. 9, 2008

(30) Foreign Application Priority Data

Apr. 3, 2007 (JP) ............... 2007-097441

(51) Int. Cl.
*H01L 29/66* (2006.01)
*H01L 29/00* (2006.01)

(52) U.S. Cl. ............... 257/280; 257/267; 257/E27.068; 257/E21.047

(58) Field of Classification Search ............ 257/54, 257/73, 280–284, 267, 407, 103, 751, E27.068, 257/E21.047; 438/232, 481, 687, 672, 573, 438/582, 588, 591, 648, 656, 652
See application file for complete search history.

(56) References Cited

U.S. PATENT DOCUMENTS

| | | | |
|---|---|---|---|
| 4,791,471 A * | 12/1988 | Onodera et al. ............ | 257/280 |
| 7,033,940 B1 * | 4/2006 | Marathe et al. ............ | 438/687 |
| 2002/0030274 A1 * | 3/2002 | Chopra ..................... | 257/751 |
| 2003/0098487 A1 * | 5/2003 | Ngo et al. .................. | 257/382 |
| 2003/0186541 A1 * | 10/2003 | Liou et al. ................. | 438/643 |
| 2004/0164362 A1 * | 8/2004 | Conley et al. .............. | 257/407 |
| 2005/0156316 A1 * | 7/2005 | Lee et al. .................. | 257/751 |
| 2005/0176220 A1 * | 8/2005 | Kanemoto .................. | 438/481 |
| 2005/0269703 A1 * | 12/2005 | Dunn et al. ................ | 257/751 |
| 2005/0277292 A1 * | 12/2005 | Peng et al. ................ | 438/672 |
| 2006/0118809 A1 * | 6/2006 | Parikh et al. .............. | 257/103 |
| 2006/0145201 A1 * | 7/2006 | Shiga ....................... | 257/280 |
| 2006/0231871 A1 * | 10/2006 | Amasuga et al. ............ | 257/279 |

FOREIGN PATENT DOCUMENTS

CN 1855530 A 1/2006

(Continued)

OTHER PUBLICATIONS

Kola et al. Thin film resistors and capacitors for advanced packaging. 1997 International Symposium on Advanced Packaging Materials, pp. 71-74.*

(Continued)

*Primary Examiner*—Lynne A Gurley
*Assistant Examiner*—Galina Yushina
(74) *Attorney, Agent, or Firm*—Leydig, Voit & Mayer, Ltd.

(57) ABSTRACT

A transistor includes a nitride semiconductor layer and a gate electrode layer. The gate electrode layer includes a tantalum nitride layer on the nitride semiconductor layer. The tantalum nitride layer forms a Schottky junction with the nitride semiconductor layer. The transistor also includes an insulating film on the nitride semiconductor layer. The insulating film surrounds the gate electrode layer. A first portion of the gate electrode layer, in contact with the nitride semiconductor layer, has a higher nitrogen mole fraction than a second portion of the gate electrode layer.

19 Claims, 4 Drawing Sheets

FOREIGN PATENT DOCUMENTS

| | | |
|---|---|---|
| EP | 0 531 805 A | 3/1993 |
| JP | 61-183961 A | 8/1986 |
| JP | 61-203672 A | 9/1986 |
| JP | 62-130567 A | 6/1987 |
| JP | 5-211175 A | 8/1993 |

OTHER PUBLICATIONS

Hayes et al. THermal stability of TaN Schottky contacts on n-GaN. Acta Materialia, 51, (2003), pp. 653 0 663.*

* cited by examiner

TRANSISTOR

FIELD OF THE INVENTION

The present invention relates to transistors, and more particularly to transistors in which an electrode forms a Schottky junction with a semiconductor layer

BACKGROUND ART

Transistors in which the gate electrode forms a Schottky junction with the semiconductor substrate have been known in the art (see, e.g., JP-A-62-130567, JP-A-61-203672, JP-A-61-183961, and JP-A-5-211175.)

Suitable examples of gate electrode materials include tantalum nitride (TaN). A gate electrode formed of TaN can provide an appropriate Schottky barrier height $\Phi_b$ and an appropriate ideality factor (n-value) and have high moisture resistance.

However, if the transistor is stored under high temperature conditions with the TaN gate electrode exposed to ambient atmosphere, the gate electrode and the immediately underlying semiconductor substrate suffer nitrogen dissociation and oxidation, resulting in reduced reliability of the device under elevated temperature conditions.

SUMMARY OF THE INVENTION

The present invention has been devised to solve these problems. It is, therefore, an object of the present invention to provide a transistor employing an electrode that provides an appropriate Schottky barrier height and an appropriate ideality factor and that has high heat resistance.

According to one aspect of the present invention, a transistor includes a nitride semiconductor layer and a gate electrode layer. The gate electrode layer includes a tantalum nitride layer being formed on the nitride semiconductor layer. The tantalum nitride layer forms a Schottky junction with the nitride semiconductor layer. The transistor also includes an insulating film formed on the nitride semiconductor layer. The insulating film surrounds the gate electrode layer. The portion of the gate electrode layer in contact with the nitride semiconductor layer has a higher nitrogen mole fraction than the other portion of the gate electrode layer.

Other and further objects, features and advantages of the invention will appear more fully from the following description.

DETAILED DESCRIPTION OF THE PREFERRED EMBODIMENTS

First Embodiment

Figure 1:
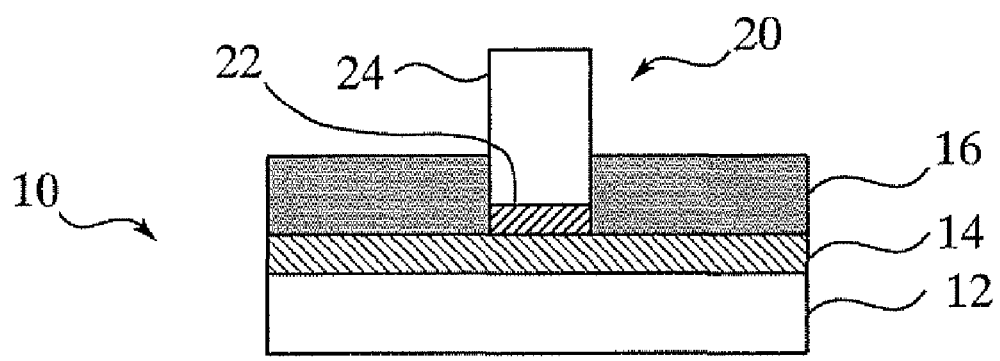
FIG. 1 is a diagram illustrating the configuration of a transistor according to a first embodiment of the present invention.

FIG. 1 is a diagram illustrating the configuration of a transistor 10 according to the first embodiment of the present invention. More specifically, FIG. 1 shows a gallium nitride (GaN) transistor having a Schottky junction gate electrode of tantalum nitride (TaN) (hereinafter also referred to as a "Schottky gate transistor"). According to the present embodiment, this transistor 10 is a GaN High Electron Mobility Transistor (HEMT).

FIG. 1 shows an enlarged view of the gate electrode 20 and the surrounding structure thereof of the transistor 10 of the present embodiment. In this transistor, an AlGaN layer 14 (a compound semiconductor layer) is formed over a GaN layer 12 (a compound semiconductor layer), and a TaN layer 22 is formed on the AlGaN layer 14. The TaN layer 22 forms a Schottky junction with the AlGaN layer 14. An insulating film 16 of SiN surrounds the periphery of the TaN layer 22.

Further, a TaN layer 24 is formed on the TaN layer 22 and in contact with the insulating film 16. Thus, the TaN layer 22 is covered by the surrounding insulating film 16 and the overlying TaN layer 24. The gate electrode 20 is made up of the TaN layers 22 and 24.

The TaN layer 24 is less nitrided than the underlying TaN layer 22 (that is, the TaN layer 24 has a lower nitrogen mole fraction than the TaN layer 22). According to the present embodiment, the TaN layer 22 has an N/Ta mole ratio of 1.3-1.7, and the TaN layer 24 has an N/Ta mole ratio of 0.9-1.3. The following example assumes that the TaN layer 22 has an N/Ta mole ratio of 1.5 and the TaN layer 24 has an N/Ta mole ratio of 1.1.

Though not shown, the source and drain electrodes are located at other positions on the AlGaN layer 14. Thus, in the transistor of the present embodiment, the gate electrode 20 is made up of the highly nitrided TaN layer 22, which is in direct contact with the underlying AlGaN layer 14, and the moderately nitrided TaN layer 24, which overlies the TaN layer 22.

FIG. 2 shows process steps in an exemplary method for manufacturing the transistor 10 of the present embodiment. This manufacturing method begins by depositing SiN on a compound semiconductor layer stack (including a GaN layer 12 and an AlGaN layer 14) to form an insulating film 16, as shown in FIG. 2A. The insulating film 16 is then selectively removed by wet etching to define where the gate electrode is to be formed, as shown in FIG. 2B. TaN layers 22 and 24 are then sequentially formed by sputtering, as shown in FIG. 2C. At that time, the $N_2$ gas pressure is set higher when the TaN layer 22 is formed than when the TaN layer 24 is formed to produce a layer stack that includes differently nitrided layers, or layers having different nitrogen mole fractions. (Specifically, the TaN layer 22 is highly nitrided and the TaN layer 24 is moderately or slightly nitrided.) Next, a resist film 30 is applied where the gate electrode 20 is to be formed, and the TaN layers 22 and 24 are removed by ion trimming except for the portions underlying the resist film 30, as shown in FIG. 2D. The resist film 30 is then removed, thus forming the gate electrode 20, as shown in FIG. 2E.

A gate electrode made up of a TaN layer can provide an appropriate Schottky barrier height $\Phi_b$ and an appropriate ideality factor (n-value). Specifically, for example, the Schottky junction has good characteristics when the gate electrode has an N/Ta mole ratio within the range of approximately 1.3-1.7 (that is, when the gate electrode is relatively highly nitrided).

On the other hand, if the TaN layer is exposed to high temperature, the layer and the immediately underlying semiconductor layer undergo nitrogen dissociation and oxidation. Such degradation of the gate electrode starts at the portions exposed to the atmosphere under high temperature conditions.

Figure 8:
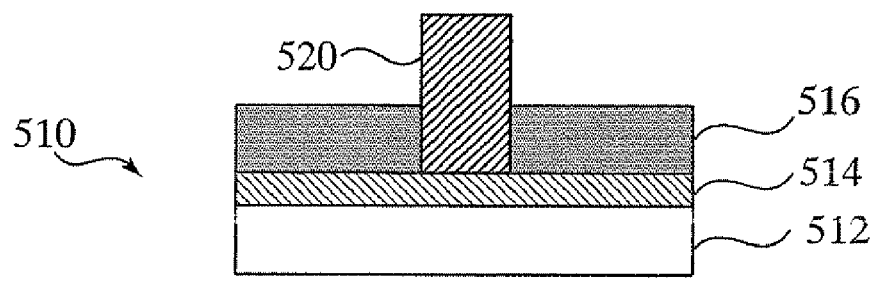
FIG. 8 is a diagram showing a comparative transistor.

FIG. 8 is a diagram showing a comparative transistor 510 whose gate electrode is made up of a TaN layer. Referring to the figure, the transistor 510 includes a GaN layer 512, an AlGaN layer 514, an insulating film 516, and a gate electrode 520 which is made up of a single TaN layer having a predetermined nitrogen mole fraction (or nitrided to a predetermined degree). In this comparative transistor, the TaN layer is exposed to ambient atmosphere.

Figure 3:
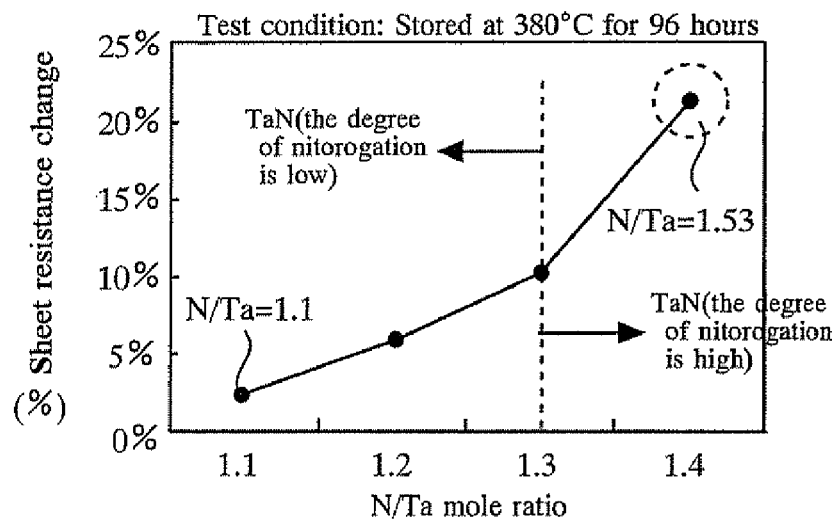
FIG. 3 shows the relationship between the N/Ta mole ratio of a TaN gate electrode and its heat resistance characteristics.

It should be noted that in the case of electrodes made up of a TaN layer, the higher the N/Ta mole ratio, the higher the rate of degradation. FIG. 3 shows the relationship between the N/Ta mole ratio of a TaN gate electrode and its heat resistance characteristics, obtained from an experiment conducted by the present inventor. Specifically, FIG. 3 shows the relationship between the N/Ta mole ratio of the gate electrode and the sheet resistance change resulting from the electrode being subjected to a high temperature storage test (stored at 380° C. for 96 hours). As shown in FIG. 3, the sheet resistance change increased with increasing N/Ta mole ratio.

It should be noted that larger sheet resistance change means lower heat resistance. That is, FIG. 3 indicates that the heat resistance of the gate electrode increases as the degree of nitridation decreases. Especially, the sheet resistance change increases at a greater rate at N/Ta mole ratios higher than 1.3. That is, in order for the gate electrode (or TaN layer) to have high heat resistance, its N/Ta mole ratio is preferably approximately between 0.9 to 1.3 (that is, the gate electrode is preferably not highly nitrided), since the electrode exhibits a significant reduction in heat resistance under elevated temperature conditions if the ratio exceeds 1.3.

As described above, in order for the gate electrode to have good (Schottky junction) characteristics, the TaN layer making up the gate electrode preferably has an N/Ta mole ratio of approximately 1.3-1.7. However, in the case of the comparative transistor shown in FIG. 8 in which the gate electrode 520 is exposed to ambient atmosphere, an increase in the N/Ta mole ratio results in a reduction in the heat resistance of the gate electrode 520. On the other hand, if the N/Ta mole ratio of the TaN layer (or the gate electrode) is reduced to enhance the heat resistance of the electrode, then its Schottky junction characteristics (such as the Schottky barrier height $\Phi_b$ and the ideality factor (n-value)) will degrade. Thus, the comparative transistor shown in FIG. 8 is disadvantageous in that increasing the N/Ta mole ratio of the gate electrode to achieve good (Schottky junction) characteristics results in a reduction in the heat resistance of the electrode.

To address this problem, the transistor of the present embodiment has a two-layer TaN gate electrode structure in which the moderately nitrided TaN layer 24 is stacked on the highly nitrided TaN layer 22 which is in contact with the underlying semiconductor layer, as described in FIG. 1. The TaN layer 22 has a smaller thickness than the insulating film 16 on both sides of the TaN layer 22.

With this arrangement, the top and sides of the TaN layer 22 can be covered by the moderately nitrided TaN layer 24 and the insulating film 16, respectively. Further, since the TaN layer 22 is highly nitrided (i.e., has an N/Ta mole ratio of 1.3-1.7), the gate electrode has good Schottky junction characteristics (i.e., an appropriate Schottky barrier height and an appropriate ideality factor, or n-value). In addition, since the TaN layer 24 covering the TaN layer 22 is moderately nitrided (i.e., has an N/Ta mole ratio of 0.9-1.3), the gate electrode has high heat resistance and hence does not degrade even when exposed to ambient atmosphere and to elevated temperature conditions. By this configuration, TaN layer 24 covers the TaN layer 22 from exposure to ambient atmosphere, and it is possible to obtain the gate electrode having high heat resistance.

Thus, the transistor of the present embodiment has a two-layer gate electrode structure including two stacked TaN layers having different nitrogen mole fractions. This allows the highly nitrided TaN layer 22 to be reliably protected while minimizing the risk of delamination(peeling) between the two TaN layers 22 and 24. Further, the gate electrode 20 of the present embodiment is advantageous in that it can be manufactured only by forming a TaN layer while changing its nitridation rate.

In the transistor of the first embodiment, the top and sides of the TaN layer 22 are covered by the TaN layer 24 and the insulating film 16, respectively. However, the present invention is not limited to this particular arrangement. For example, when the highly nitrided TaN layer 22 is formed to have a larger thickness than the insulating film 16, the moderately nitrided TaN layer 24 may cover both the top and sides of the TaN layer 22.

It should be noted that, in the transistor of the first embodiment, the insulating film 16 may be formed to also cover the sides of the TaN layer 22, thus reducing the externally exposed area of the gate electrode 20. Further, although in the first embodiment the insulating film 16 formed on the AlGaN layer 14 is made of SiN, it may be formed of any other suitable insulating material such as $SiO_2$.

In the transistor of the first embodiment, the TaN layer 22 has an N/Ta mole ratio of 1.5 and the TaN layer 24 has an N/Ta mole ratio of 1.1. However, the present invention is not limited to these particular mole ratios. The TaN layers may be each nitrided to any suitable degree if the TaN layer 24 is less nitrided than the TaN layer 22 (that is, if the TaN layer 24 has a lower nitrogen mole fraction than the TaN layer 22).

Therefore, the N/Ta mole ratios of the TaN layers 22 and 24 may be appropriately determined so that the gate electrode has good Schottky junction characteristics and high heat resistance. Specifically, the TaN layer 22 may have an N/Ta mole ratio of 1.3-1.7 so that the gate electrode has good Schottky junction characteristics (i.e., has an appropriate Schottky barrier height $\Phi_b$ and an appropriate ideality factor (n-value)), and the TaN layer 24 may have an N/Ta mole ratio of 0.9-1.3 so that the gate electrode has high heat resistance, as described above. It should be noted that the TaN layer 22 must have a higher nitrogen mole fraction than the TaN layer 24.

Figure 4:
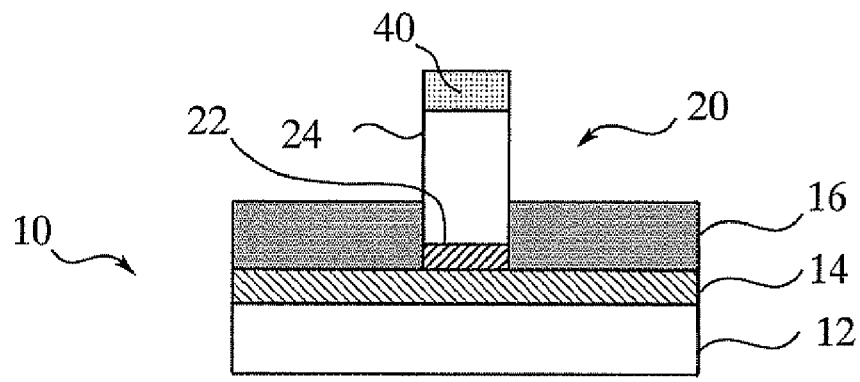
FIG. 4 is a diagram showing the configuration of a variation of the transistor of the first embodiment.

FIG. 4 is a diagram showing the configuration of still another variation of the transistor of the first embodiment. In the transistor 10 shown in FIG. 4, the TaN layer 24 of the gate electrode 20 includes a low resistance layer 40 formed of a low specific resistance material. In this example, the low resistance layer 40 is formed of gold (Au), which allows the gate electrode to have low resistance. It should be noted that other low specific resistance materials such as Cu (having a specific resistance of 1.9 $\mu\Omega$·cm) may be used instead of Au (having a specific resistance of 2.1 $\mu\Omega$·cm).

Figure 5:
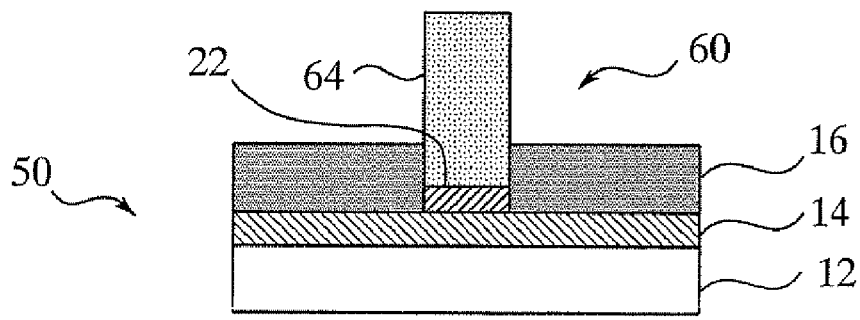
FIG. 5 is a diagram showing the configuration of a variation of the transistor of the first embodiment.

FIG. 5 is a diagram showing the configuration of still another variation of the transistor of the first embodiment. In the transistor 50 shown in FIG. 5, the gate electrode 60 includes, in addition to the TaN layer 22, a Ta layer 64 (unnitrided), instead of the TaN layer 24. As described above, the lower the degree of nitridation of a TaN layer, the higher the heat resistance of the layer. Therefore, the gate electrode 60 made up of the TaN layer 22 and the Ta layer 64 has further enhanced heat resistance. It should be noted that a method for manufacturing this transistor differs from the method shown in FIG. 2 only in that it includes a step of forming a Ta layer on the TaN layer 22 instead of the step shown in FIG. 2C where the TaN layer 24 is formed on the TaN layer 22.

The present embodiment has been described with reference to the high electron mobility transistor 10 having a gate electrode structure of the present invention. However, the present invention is not limited to high electron mobility transistors. The present invention may be applied to any transistor having a Schottky junction gate electrode.

Second Embodiment

Figure 6:
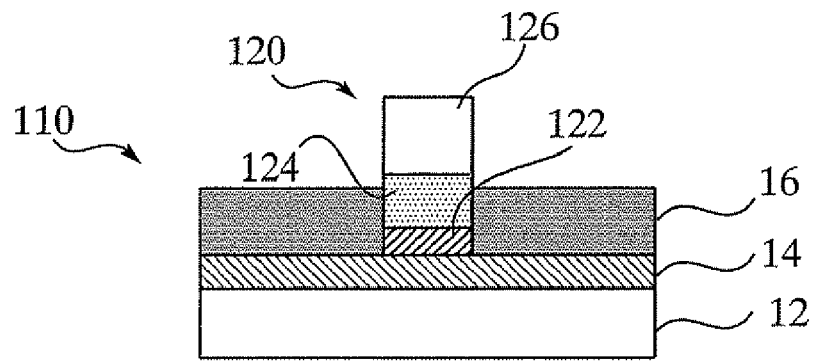
FIG. 6 is a diagram showing the configuration of a transistor according to a second embodiment of the present invention.

FIG. 6 is a diagram showing the configuration of a transistor 110 according to the second embodiment of the present invention. The transistor 110 shown in FIG. 6 is similar to the transistor 10 of the first embodiment shown in FIG. 1 except that it includes a gate electrode 120 instead of the gate electrode 20. The following description will be directed to the gate electrode 120, which characterizes the present embodiment.

In the second embodiment, the TaN layer 122 is highly nitrided and has an N/Ta mole ratio of 1.5, as in the case of the TaN layer 22 of the first embodiment. The TaN layer 124 formed on the TaN layer 122 is less nitrided than the TaN layer 122 and has an N/Ta mole ratio of 1.3. The TaN layer 126 formed on the TaN layer 124 is less nitrided than the TaN layer 124 and has an N/Ta mole ratio of 1.1. Thus, the N/Ta mole ratio of each TaN layer decreases successively from the lowermost TaN layer (the TaN layer 122) to the uppermost TaN layer (the TaN layer 126).

In the case of a gate electrode having a two-layer structure such as that shown in FIG. 1, if the two TaN layers differ greatly in their N/Ta mole ratio, delamination may occur between them due to the stress occurring at the interface. To prevent this, the gate electrode 120 shown in FIG. 6 includes three TaN layers, and the N/Ta mole ratio of each TaN layer decreases successively from the lowermost layer to the uppermost layer (as described above), thereby reducing the interface stress and preventing delamination of the TaN layers of the gate electrode.

Figure 2A:
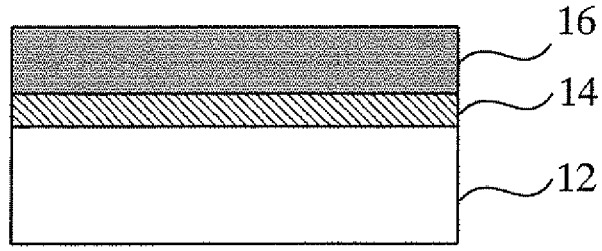
FIG. 2 shows process steps in an exemplary method for manufacturing the transistor of the first embodiment.
Figure 2B:
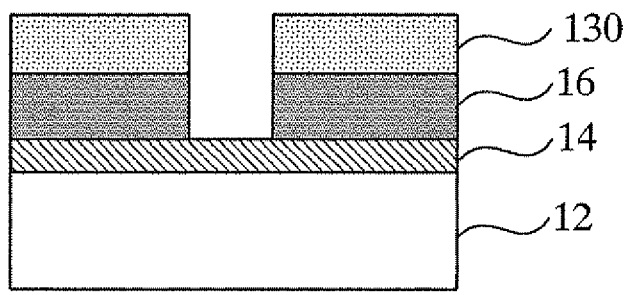
Figure 2C:
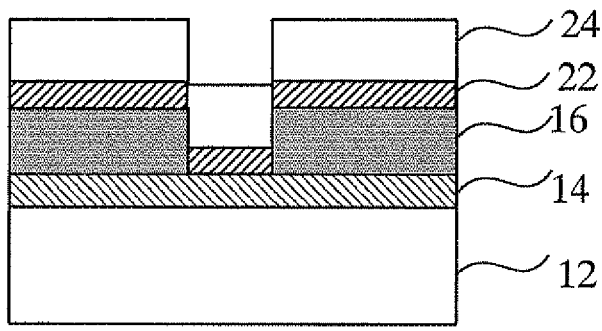
Figure 2D:
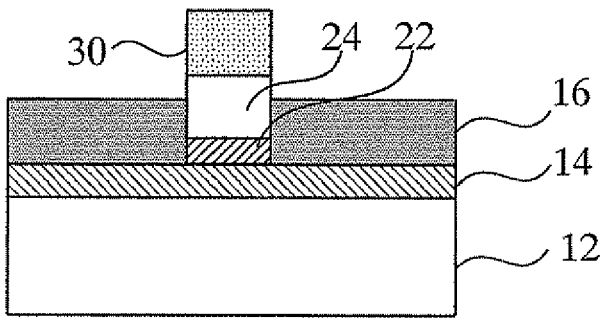
Figure 2E:
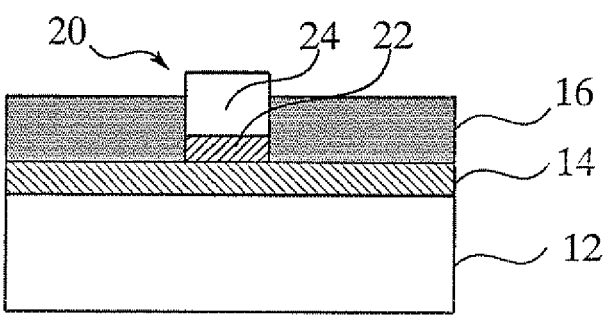

It should be noted that a method for manufacturing the transistor 110 of the present embodiment differs from the method shown in FIG. 2 only in that it includes a step of forming a plurality of TaN layers (namely, three TaN layers) while successively changing the rate of nitridation, instead of the step shown in FIG. 2C.

In the transistor of the second embodiment, the gate electrode 120 has a three-layer structure that includes the TaN layers 122, 124, and 126. However, the present invention is not limited to this particular arrangement. For example, the gate electrode may include a larger number of TaN layers (four or five TaN layers, etc.) stacked on one another, and the N/Ta mole ratio of each TaN layer may decrease successively from the lowermost layer to the uppermost layer, resulting in a smaller change in N/Ta mole ratio between adjacent TaN layers and hence resulting in reduced interface stress.

Third Embodiment

Figure 7:
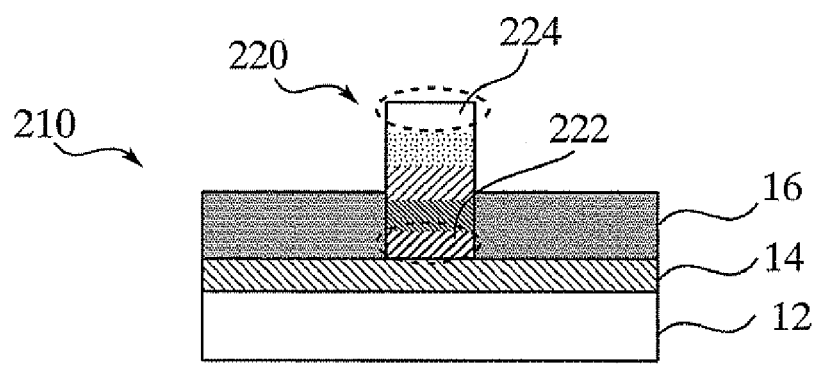
FIG. 7 is a diagram showing the configuration of a transistor according to a third embodiment of the present invention.

FIG. 7 is a diagram showing the configuration of a transistor 210 according to the third embodiment of the present invention. The transistor 210 shown in FIG. 7 is similar to the transistor 10 of the first embodiment shown in FIG. 1 except that it includes a gate electrode 220 instead of the gate electrode 20.

The gate electrode 220 of the transistor 210 of the present embodiment is formed of TaN, as in the case of the gate electrodes of the first and second embodiments. Further, according to the present embodiment, the portion 222 of the gate electrode 220 in contact with the AlGaN layer 14 is highly nitrided, as with the TaN layer 22 of the first embodiment, and the N/Ta mole ratio of the gate electrode 220 decreases stepwise (or gradually) with increasing distance from the contact portion 222. As a result, the top portion 224 of the gate electrode 220 which is exposed to ambient atmosphere is moderately or slightly nitrided, as with the TaN layer 24 of the first embodiment. This arrangement allows the gate electrode 220 to have good Schottky junction characteristics and high heat resistance and avoid the interface-stress-induced delamination problem described in connection with the second embodiment.

It should be noted that a method for manufacturing the transistor 210 differs from the method shown in FIG. 2 only in that it includes a step of forming a TaN layer by sputtering while gradually changing the $N_2$ gas pressure, instead of the step shown in FIG. 2C.

It is to be understood that features or aspects of the above variations of the first embodiment can be applied to the second and third embodiments. For example, the gate electrodes 120 and 220 may include stacked layers of a low specific resistance metal. Further, the gate electrode 120 may include a Ta layer instead of the TaN layer 126.

The features and advantages of the above embodiments may be summarized as follows. Thus, in the above transistor of the present invention, the portion of the gate electrode layer in contact with the underlying nitride semiconductor layer is formed of a highly nitrided tantalum material to achieve good Schottky contact characteristics. The portion of the gate electrode layer not in contact with the nitride semiconductor layer, on the other hand, is formed of a moderately or slightly nitrided tantalum material, covering the highly nitrided portion (adjacent the nitride semiconductor layer) from exposure to ambient atmosphere. It should be noted that high temperature degradation of a gate electrode layer starts at the exposed portions, and the higher the degree of nitridation, the higher the rate of degradation. That is, the above gate electrode layer is unlikely to degrade under elevated temperature conditions, since the moderately nitrided portion of the gate electrode layer covers the highly nitrided portion and thereby prevents exposure of the high nitrided portion, as described above. This allows the gate electrode layer of the transistor to provide an appropriate Schottky barrier height and an appropriate ideality factor and have high heat resistance.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-097441, filed on Apr. 3, 2007 including specification, claims, drawings and summary, on which the Convention priority of the present application is based, are incorporated herein by reference in its entirety.

The invention claimed is:

1. A transistor comprising:
  a nitride semiconductor layer;
  a gate electrode including
    a first tantalum nitride layer having a first nitrogen content, located on and in contact with said nitride semiconductor layer, and forming a Schottky junction with said nitride semiconductor layer, and a second tantalum nitride layer having a second nitrogen content, lower than the first nitrogen content, and in contact with said first tantalum nitride layer; and an insulating film located on said nitride semiconductor layer, surrounding and in contact with at least said first tantalum nitride layer.

2. The transistor according to claim 1, wherein said insulating film and said second tantalum nitride layer, together, cover all of said first tantalum nitride layer.

3. The transistor according to claim 1, including a low resistance layer having a lower specific resistance than said gate electrode layer and disposed in contact with said second tantalum nitride layer.

4. The transistor according to claim 1, wherein:

said second tantalum nitride layer includes a plurality of tantalum nitride layers stacked on one another; and said plurality of tantalum nitride layers of said second tantalum nitride layer have successively lower N/Ta mole ratios with increasing distance from said first tantalum nitride layer and said first tantalum nitride layer has a higher N/Ta mole ratio than any other tantalum nitride layer of said gate electrode.

5. The transistor according to claim 1, wherein said insulating film has a larger thickness than said first tantalum nitride layer.

6. The transistor according to claim 2, wherein:

said second tantalum nitride layer includes a plurality of tantalum nitride layers stacked on one another; and said plurality of tantalum nitride layers of said second tantalum nitride layer have successively lower N/Ta mole ratios with increasing distance from said first tantalum nitride layer and said first tantalum nitride layer has a higher N/Ta mole ratio than any other tantalum nitride layer of said gate electrode.

7. The transistor according to claim 2, wherein said insulating film has a larger thickness than said first tantalum nitride layer.

8. The transistor according to claim 2, wherein said first tantalum nitride layer has a N/Ta mole ratio of at least 1.3, and said second tantalum nitride layer has an N/Ta mole ratio less than 1.3.

9. The transistor according to claim 2, including a low resistance layer having a lower specific resistance than said gate electrode layer and disposed in contact with said second tantalum nitride layer.

10. The transistor according to claim 2 wherein part of said second tantalum nitride layer is exposed from and not covered by said insulating film.

11. The transistor according to claim 6, wherein said insulating film has a larger thickness than said first tantalum nitride layer.

12. The transistor according to claim 6, wherein said first tantalum nitride layer has a N/Ta mole ratio of at least 1.3, and said second tantalum nitride layer has a N/Ta mole ratio less than 1.3.

13. The transistor according to claim 6 wherein part of said second tantalum nitride layer is exposed from and not covered by said insulating film.

14. The transistor according to claim 4, wherein said insulating film has a larger thickness than said first tantalum nitride layer.

15. The transistor according to claim 4, wherein said first tantalum nitride layer has a N/Ta mole ratio of at least 1.3, and said second tantalum nitride layer has a N/Ta mole ratio less than 1.3.

16. The transistor according to claim 4 wherein part of said second tantalum nitride layer is exposed from and not covered by said insulating film.

17. The transistor according to claim 14, wherein said first tantalum nitride layer has a N/Ta mole ratio of at least 1.3, and said second tantalum nitride layer has a N/Ta mole ratio less than 1.3.

18. The transistor according to claim 11, wherein said first tantalum nitride layer has a N/Ta mole ratio of at least 1.3, and said second tantalum nitride layer has a N/Ta mole ratio less than 1.3.

19. A transistor comprising:

a nitride semiconductor layer;

a gate electrode on and in contact with said nitride semiconductor layer; and an insulating film located on said nitride semiconductor layer, surrounding and in contact with only a part of said gate electrode, proximate said nitride semiconductor layer, wherein said gate electrode has a tantalum nitride portion in contact with and forming a Schottky barrier with said nitride semiconductor layer, and said tantalum nitride portion of said gate electrode has an N/Ta mole ratio that gradually decreases with increasing distance from said nitride semiconductor layer.

* * * * *